(12) United States Patent
Leung et al.

(10) Patent No.: US 6,922,019 B2
(45) Date of Patent: Jul. 26, 2005

(54) MICROWAVE ION SOURCE

(75) Inventors: Ka-Ngo Leung, Hercules, CA (US); Jani Reijonen, Oakland, CA (US); Rainer W. Thomae, El Cerrito, CA (US)

(73) Assignee: The Regents of the University of California, Oakland, CA (US)

( * ) Notice: Subject to any disclaimer, the term of this patent is extended or adjusted under 35 U.S.C. 154(b) by 1 day.

(21) Appl. No.: 10/150,534

(22) Filed: May 17, 2002

(65) Prior Publication Data

US 2003/0006708 A1 Jan. 9, 2003

Related U.S. Application Data

(60) Provisional application No. 60/292,056, filed on May 17, 2001, and provisional application No. 60/292,057, filed on May 17, 2001.

(51) Int. Cl.[7] .............................. H01J 7/24; G21G 5/20
(52) U.S. Cl. ............................ 315/111.21; 315/111.81; 250/492.3
(58) Field of Search ...................... 315/111.21, 111.31, 315/111.41, 111.71, 111.81, 111.91; 250/492.21, 492.3, 492.2, 398, 251; H01J 7/24; G21G 5/00

(56) References Cited

U.S. PATENT DOCUMENTS

| | | | | | |
|---|---|---|---|---|---|
| 4,806,829 | A | * | 2/1989 | Nakao | 315/111.81 |
| 4,977,352 | A | * | 12/1990 | Williamson | 315/111.81 |
| 5,198,677 | A | * | 3/1993 | Leung et al. | 250/424 |
| 5,517,084 | A | * | 5/1996 | Leung | 315/111.81 |
| 6,181,068 | B1 | * | 1/2001 | Hur et al. | 315/111.21 |
| 6,184,625 | B1 | * | 2/2001 | Ogura et al. | 315/111.81 |
| 6,236,163 | B1 | * | 5/2001 | Maishev et al. | 315/111.81 |
| 6,435,131 | B1 | * | 8/2002 | Koizumi | 118/723 ME |
| 2003/0057846 | A1 | * | 3/2003 | Kornfeld et al. | 315/111.21 |

OTHER PUBLICATIONS

Lomer, P.D.: Bounden, JE.: Wood, J.D.L.H., "High Output Neutron Generating Tubes," CONF–650405–2, Services Electronics Rach Lab (Baldock, England), pp. 623–34. (Sep. 1, 1964).

Eyrich, W.; Schmidt, A., "Two Compact, High Intensity Pulsed Neutron Sources,"(Germany), p. 589–608, (May 1, 1965).

Lomer, P.D.: Bounden, J.E.; Wood J.D.L.H., "A Neutron Tube with Constant Output "Nucl. Instr. Methods, Services Electronics Resrch LAb (Baldock, England), p. 283–288 (Mar. 1, 1965).

* cited by examiner

*Primary Examiner*—Don Wong
*Assistant Examiner*—Trinh Vo Dinh
(74) *Attorney, Agent, or Firm*—Henry P. Sartorio; Joseph R. Milner

(57) ABSTRACT

A compact microwave ion source has a permanent magnet dipole field, a microwave launcher, and an extractor parallel to the source axis. The dipole field is in the form of a ring. The microwaves are launched from the middle of the dipole ring using a coaxial waveguide. Electrons are heated using ECR in the magnetic field. The ions are extracted from the side of the source from the middle of the dipole perpendicular to the source axis. The plasma density can be increased by boosting the microwave ion source by the addition of an RF antenna. Higher charge states can be achieved by increasing the microwave frequency. A xenon source with a magnetic pinch can be used to produce intense EUV radiation.

15 Claims, 11 Drawing Sheets

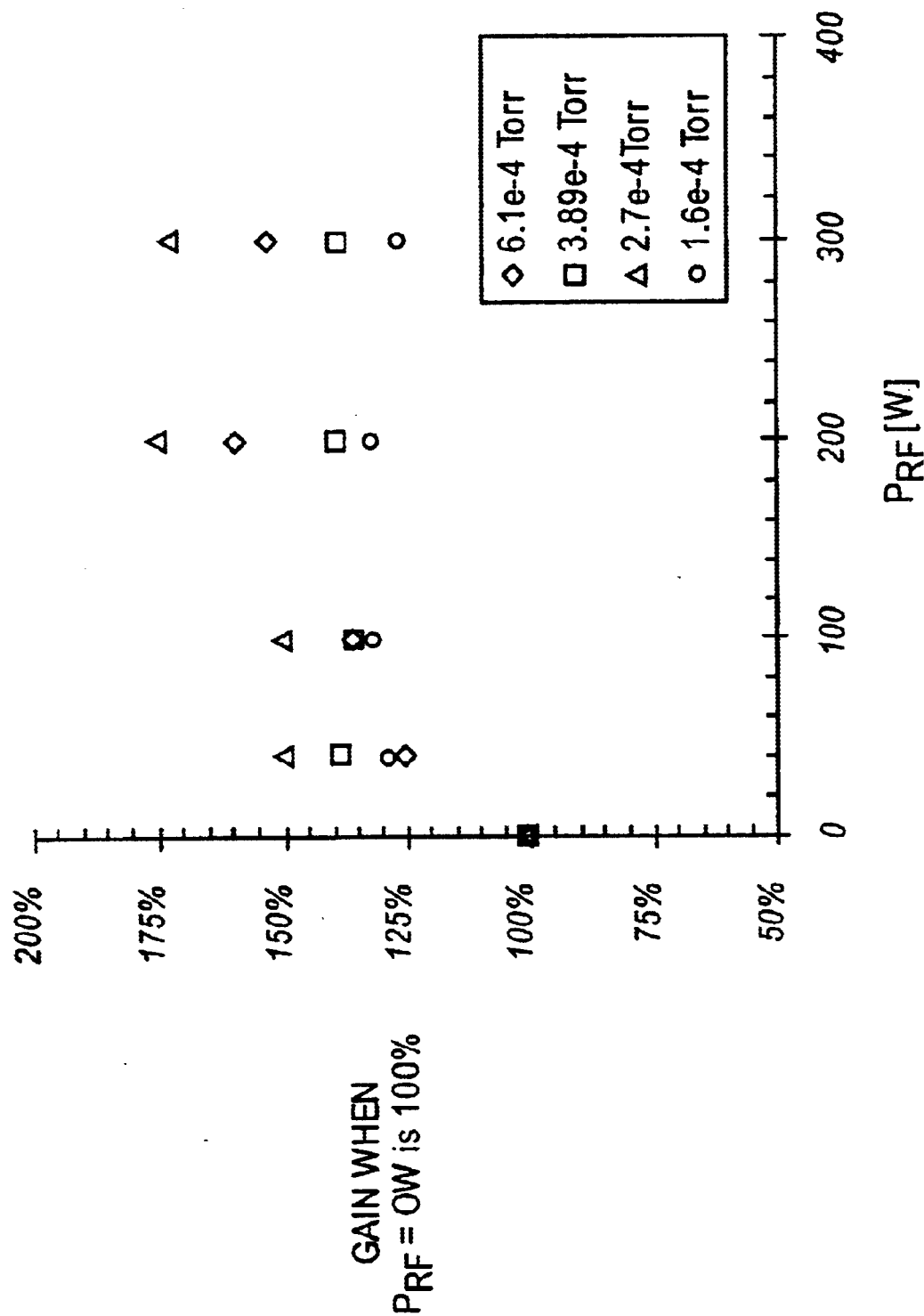

US 6,922,019 B2

MICROWAVE ION SOURCE

RELATED APPLICATIONS

This application claims priority of Provisional Applications Ser. Nos. 60/292,056 and 60/292,057, both filed May 17, 2001, which are herein incorporated by reference.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates to plasma ion sources, and more particularly electron cyclotron resonance (ECR) ion sources.

An ion source is a plasma generator from which beams of ions can be extracted. Multi-cusp ion sources have an arrangement of magnets that form magnetic cusp fields to contain the plasma. Plasma can be generated in a multi-cusp ion source by DC discharge or RF induction discharge. In an RF driven source, an induction coil or antenna placed into the ion source chamber is used for the discharge. The principles of plasma ion sources are well known in the art. Conventional multicusp ion sources are illustrated by U.S. Pat. Nos. 4,793,961; 4,447,732; 5,198,677; 6,094,012, which are herein incorporated by reference.

The electron cyclotron resonance (ECR) ion source is a type of source in which ions are obtained through ionization of a gas by electrons that are accelerated by electron cyclotron resonance. ECR sources are typically used to provide beams of multiply charged ions. ECR results from the interaction of a static magnetic field with an injected high frequency electromagnetic field, i.e. ECR heating in which electrons are circulating at the selected microwave frequency around magnetic field lines in resonance. A conventional ECR source is illustrated by U.S. Pat. No. 5,256,938, which is herein incorporated by reference.

A problem with conventional ECR sources is its complicated electromagnetic and permanent magnet structure. The plasma confining magnetic field structure typically is a superposition of a solenoid field and a multipolar field, similar to a cusp field, producing a "magnetic bottle." The magnetic field has a minimum in the center region of the source and increases towards all directions. Between the source center and the source wall there is a closed equimagnetic surface (a thin layer), called the ECR resonance layer, where the ECR frequency for the electrons equals the microwave frequency. The electrons are bounced back and forth in the magnetic mirror, gaining energy every time they pass the resonance layer, heating the electrons up to hundreds of keV. The ions are then trapped by the space charge of the electrons.

ECR sources normally operate at very low gas pressure to prevent voltage breakdown. Therefore, the plasma density and extractable current are low. It is also difficult to control charge state and output current independently. Further, ECR ion sources generally have higher ion beam emittance than other types of ion sources. Accordingly it is desirable to produce an ECR type ion source that reduces or eliminates these problems.

EUV lithography using 13 nm EUV radiation is a prime candidate for a sub-100 nm lithography tool. The 13 nm EUV radiation is generated by either a laser-produced or a plasma discharge source. The laser-produced EUV source is very low in power efficiency, expensive and large in size. The plasma discharge source is compact and economic but produces a low level of EUV radiation. The semiconductor industry is seeking a low cost, compact, intense, efficient EUV source.

The most common method of producing 13 nm EUV radiation is to employ $Xe^{+10}$ ions. If one can populate a plasma with a high concentration of $Xe^{+10}$ and the plasma density is high, then the intensity of the 13 nm radiation will meet the requirements of the next generation lithography tool.

SUMMARY OF THE INVENTION

The invention is a compact microwave ion source with a permanent magnet dipole field, a microwave launcher, and an extractor parallel to the source axis. The dipole field is in the form of a ring. The microwaves are launched from the middle of the dipole ring using a coaxial waveguide. Electrons are heated using ECR in the magnetic field. The ions are extracted from the side of the source from the middle of the dipole perpendicular to the source axis.

This source uses the same type of microwave heating as a conventional ECR source but uses a simple permanent magnet dipole instead of the complicated electromagnetic and permanent magnet structure of a conventional ECR source. The dipole field corresponds to the resonance field of the microwave frequency. The source can be operated at high pressure to produce high plasma density. The plasma is uniform over a large area across the extraction aperture. There is no high magnetic field in the extraction region so the beam emittance is improved.

The plasma density can be increased by boosting the microwave ion source by the addition of an RF antenna. Higher charge states can be achieved by increasing the microwave frequency. A xenon source with a magnetic pinch can be used to produce intense EUV radiation. Various hybrid ECR-RF source designs can also be produced.

BRIEF DESCRIPTION OF THE DRAWINGS

FIG. 6 shows the increase in gain for the microwave ion source by RF boosting.

DETAILED DESCRIPTION OF THE INVENTION

Figure 1:
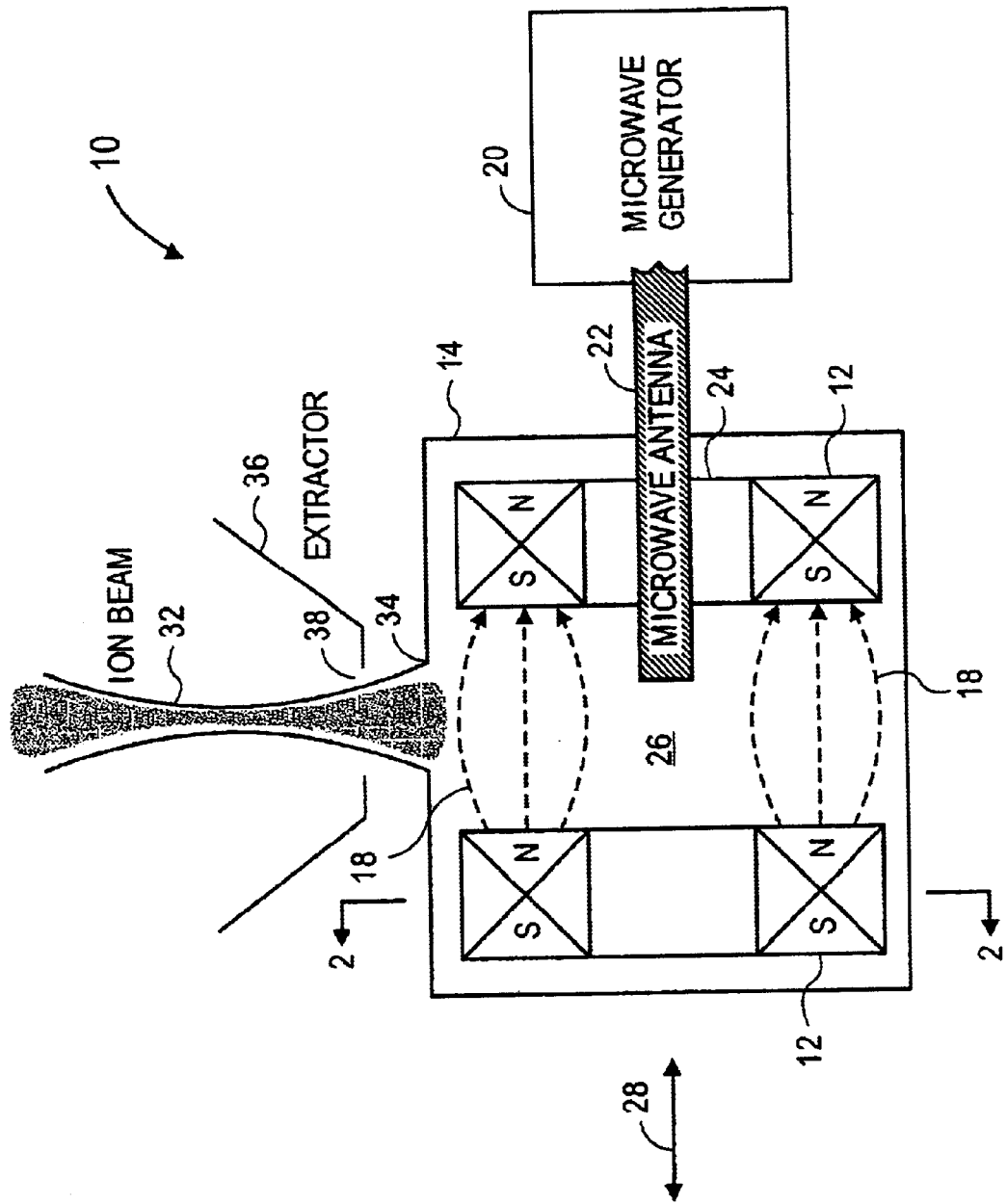
FIG. 1 is a schematic, cross-sectional side view of a compact ring dipole microwave ion source of the invention.

FIG. 1 shows a microwave source 10 of the invention, which has a pair of spaced permanent magnet rings 12 inside an ion source chamber 14. Permanent magnet rings 12 are oriented in alignment so that the N pole of one ring faces the S pole of the other ring. As a result of the opposed facing polarities, spaced magnet rings 12 produce a dipole magnetic field 18 within chamber 14 between rings 12. The dipole magnetic field 18 is oriented substantially parallel to the axis 28 of ion source 10.

Figure 2:
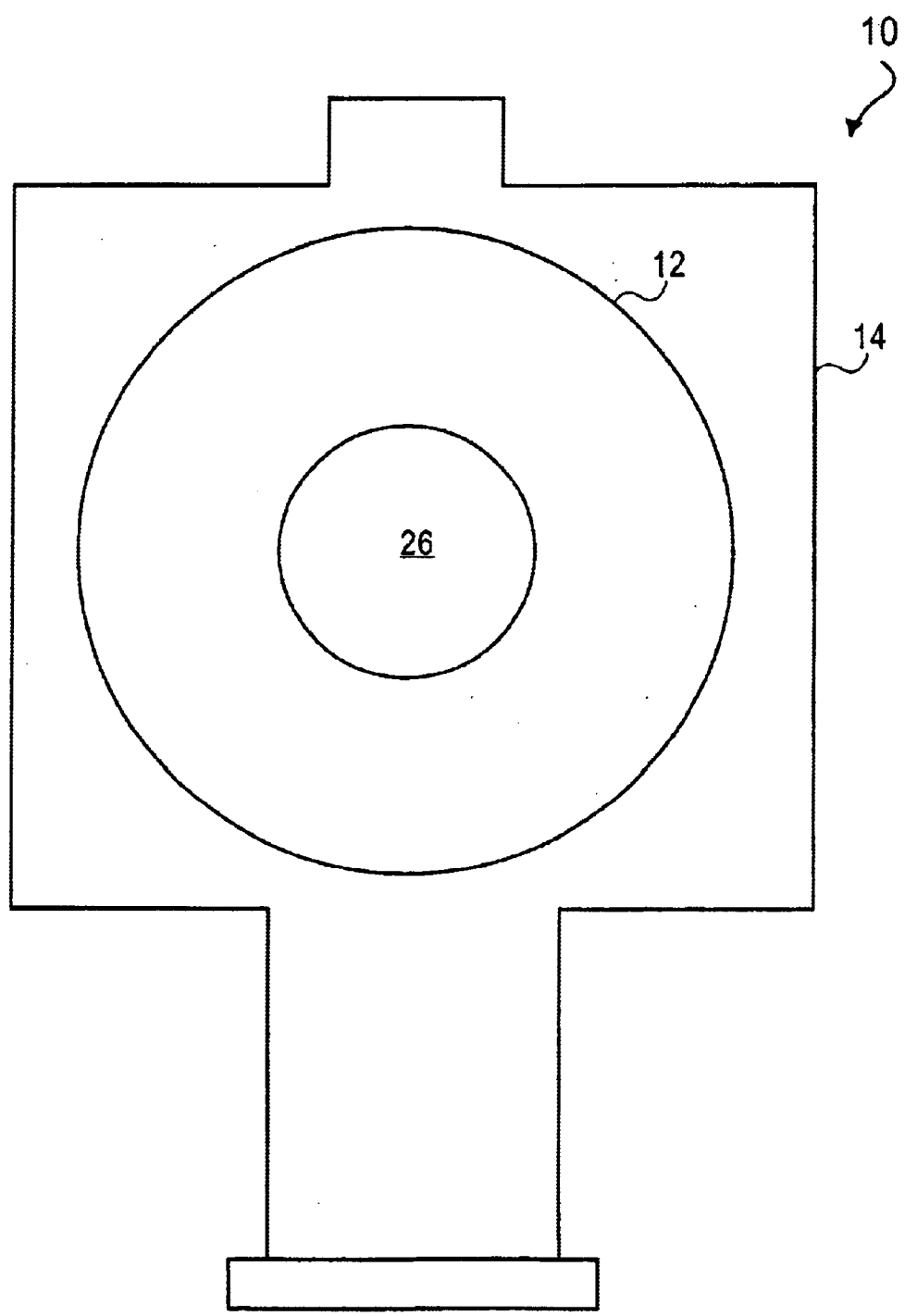
FIG. 2 is a cross-sectional end view of a permanent magnet ring in a microwave ion source chamber along line 1—1 of FIG. 1.

An orthogonal view of one of the permanent magnet rings 12 in chamber 14 is shown in FIG. 2. While each magnetic ring is shown as a single monolithic ring, it could also be formed by butting several discrete segments together.

The output of a microwave generator 20 is coupled by a microwave antenna or waveguide 22, which passes through the central aperture 24 of one of the permanent magnet rings 12, to the central region 26 inside the dipole magnetic field 18 within chamber 14. Gas of most any species which has been introduced into chamber 14 is ionized by the ECR effect as described above, i.e. by electron cyclotron resonance in the magnetic dipole field.

Figure 3:
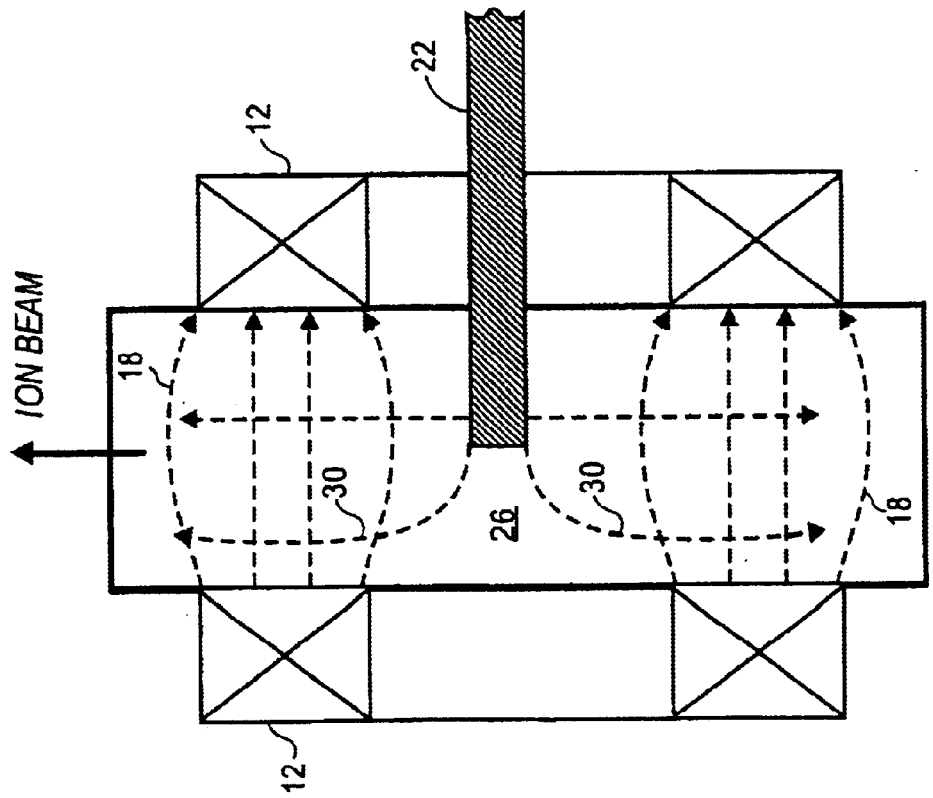
FIG. 3 illustrates the basic principle of the ring dipole microwave ion source.

The basic principle of the ring dipole microwave source is illustrated in FIG. 3. As previously described, the permanent dipole magnet rings 12 are located outside and around region 26. An electric field 30 perpendicular to the magnetic dipole field 18 is thus produced in the region 26 between the dipole rings 12 so that the ECR condition is achieved.

An ion beam 32 is extracted from the ions produced in chamber 14 through an aperture 34 in the chamber 14 using an extractor 36 having an aligned aperture 38 by applying a suitable voltage to extractor 36. The extractor 36 is substantially parallel to the source axis 28. The extraction is from the middle of the dipole field 18, perpendicular to the source axis 28. Extractor 36 is made of one of more electrodes as is well known in the ion source art; typically there are two electrodes, a first or plasma electrode and a second or extraction electrode. A double curvature extraction electrode may be used for very clean, aberration free beam formation.

In an illustrative embodiment, chamber 14 is made of stainless steel. Chamber 14 may be box shaped or cylindrical. The width or diameter is typically about 10 cm but can be any size. The permanent magnets are typically samarium cobalt (SmCo) but may be any other permanent magnetic material. The magnet rings may be air or water cooled if necessary, by appropriate coolant channels formed therein. The microwave generator is a commercial unit, and typically operates in the GHz range, e.g. 2.45 GHz, with a maximum output of 1 kW. The source can be operated at high pressure, e.g. about $10^{-4}$ Torr. The extraction voltage is generally tens of kV. Aperture 34 may be about 3 mm in diameter and aperture 38 may be about 7 mm in diameter.

Figure 4:
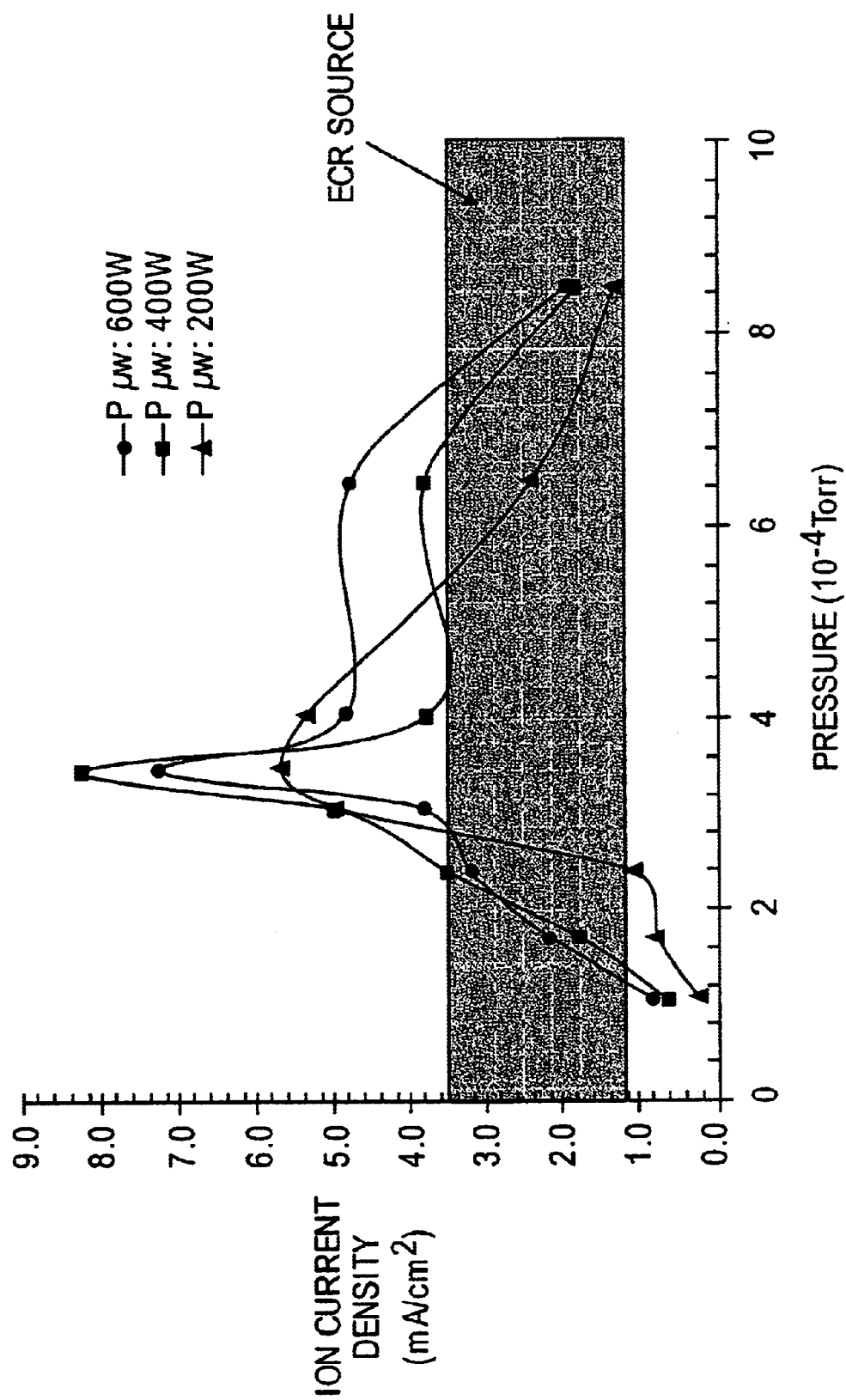
FIG. 4 is a plot of the microwave source current density as a function of pressure and microwave power.

FIG. 4 illustrates the ion current density of the microwave source as a function of pressure for the microwave power of 200 W, 400 W and 600 W. There is a region of highest current densities.

Figure 5:
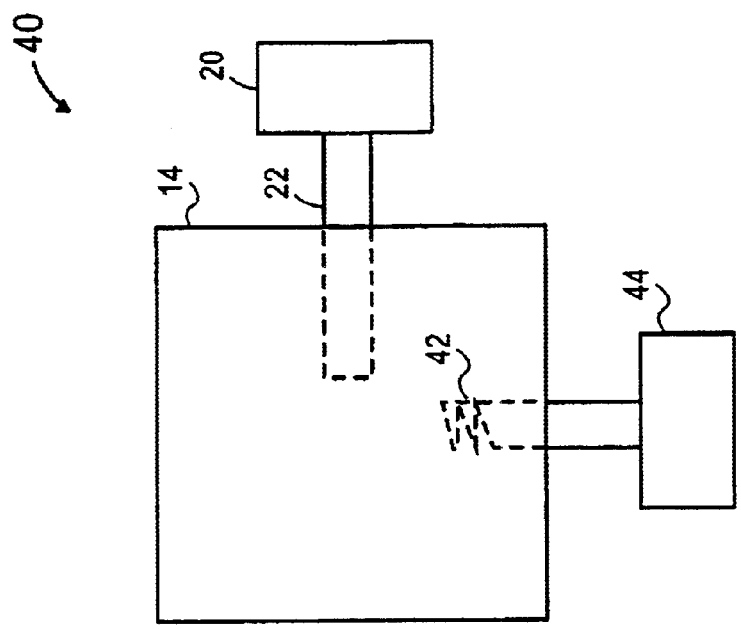
FIG. 5 is a top cross-sectional view of a microwave ion source with an RF boost.

As shown in FIG. 5, an RF boosted microwave ion source 40 is similar to microwave source 10, but is also equipped with an RF antenna 42 which is connected to an RF power source 44 (which typically includes a suitable matching network). Antenna 42 is like those used in RF driven plasma ion sources. RF source 44 operates in the MHz range, e.g. 2 MHz or 13.5 MHz, and produces plasma in chamber 14 by induction discharge from antenna 42.

By operating the microwave ion source at both frequencies, microwave and RF, simultaneously, significant boosting for the plasma density can be obtained. At the typical microwave ion source operating pressures, the microwave operation and the RF plasma operation overlap.

The increase in gain by RF boosting for a microwave ion source operating at 400 W of microwave power is shown in FIG. 6 as a function of RF power and source pressure. Every RF power level gives gain for the extracted current. The gain is smallest at the lowest pressure and increases with pressure.

Figure 7A:
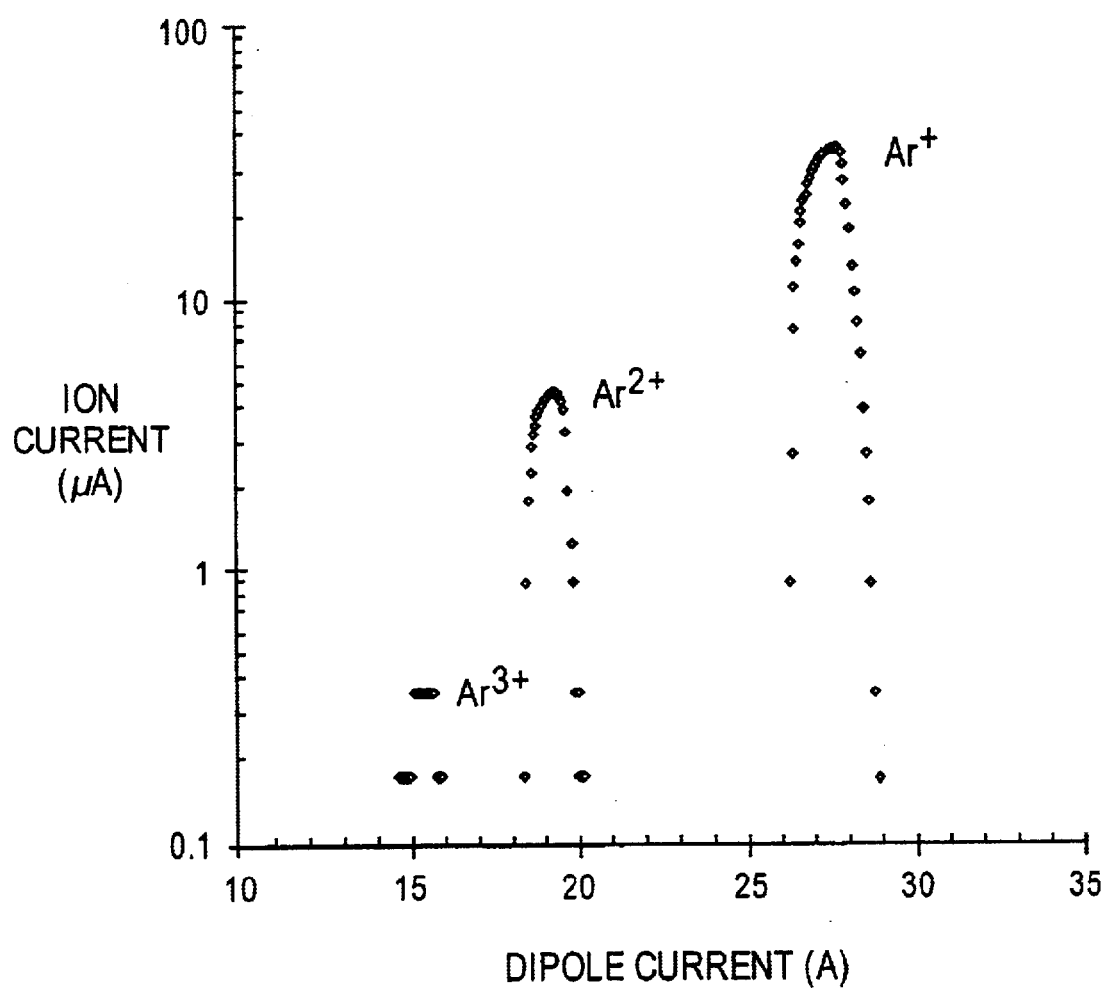
FIGS. 7A, B are plots of the charge state distribution of argon and xenon ions, respectively, from the microwave source.

The microwave ion source, like conventional ECR sources, produces multiply charged ions. FIGS. 7A, B illustrate the charge state distribution for argon and xenon ions from the microwave source. Multiple ion charge state production generally requires three factors: high electron density, long ion confinement times, and high electron energy. Since the electron density is dependent on the microwave frequency, higher charge states are obtained at higher microwave frequencies.

Figure 7B:
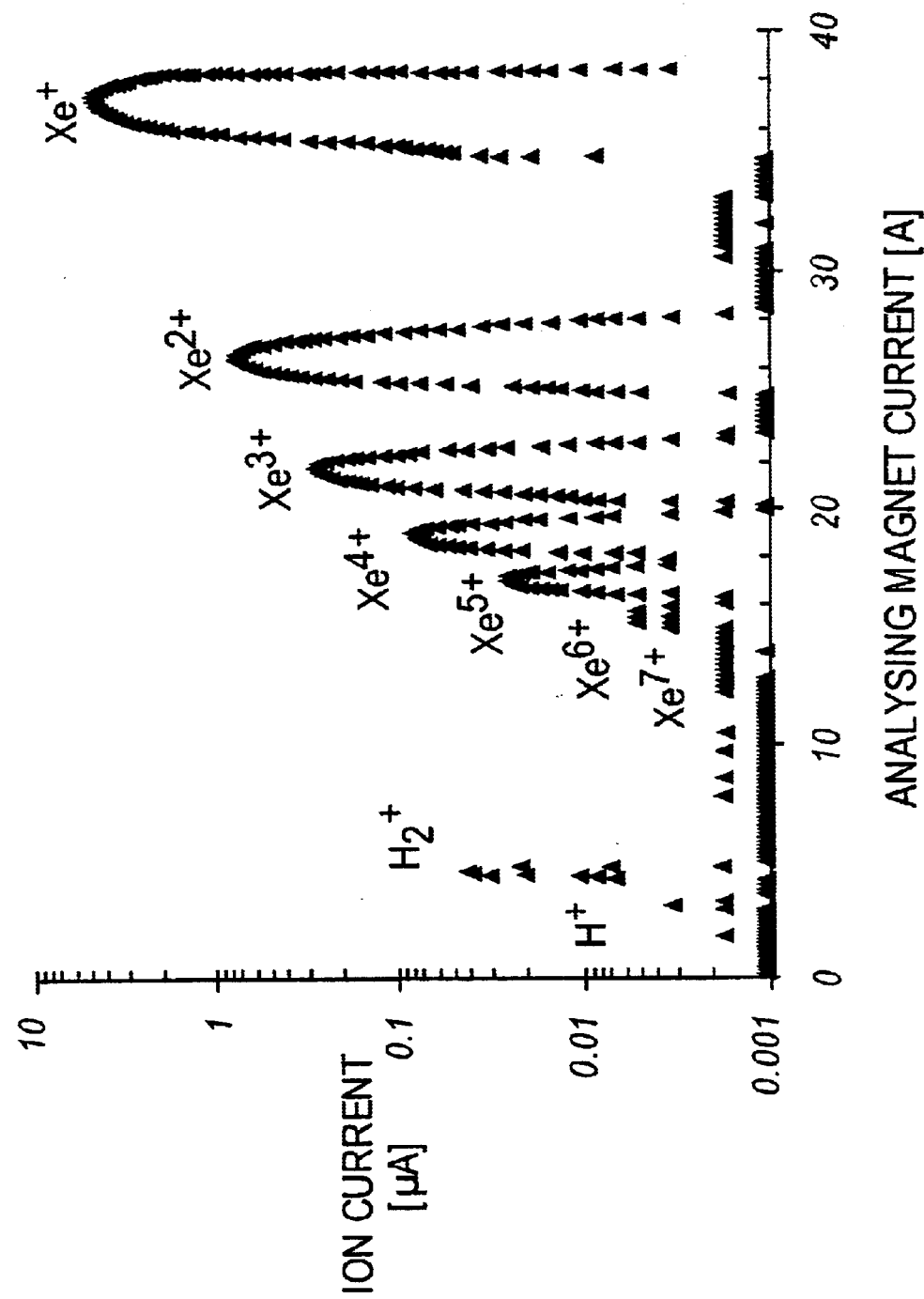

The ability to generate multiply charged ions in the microwave ion source can be used to produce $Xe^{+10}$ ions. As shown in FIG. 7B, $Xe^{+7}$ ions are produced at 2.45 GHz operation. By increasing the microwave frequency to 6 GHz or even 10 GHz, higher concentrations of higher charge states, e.g. $Xe^{+10}$, are produced. The ion species can peak at $Xe^{+10}$ by controlling the discharge conditions.

Figure 8:
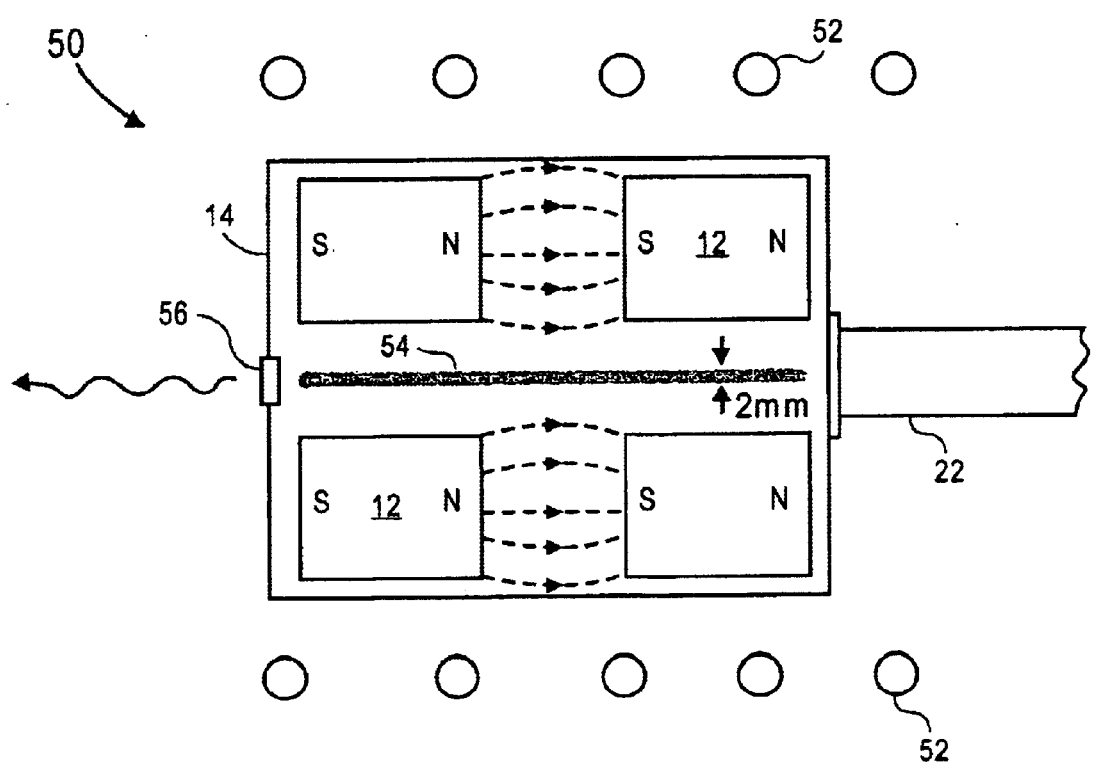
FIG. 8 is a schematic, cross-sectional side view of a pinched microwave ion source of the invention.

Since the volume of the plasma in the microwave source is quite large, the plasma has to be pinched down to a small radius to increase the plasma density. As shown in FIG. 8, a pinched microwave ion source 50 is similar to microwave source 10, but chamber 14 is surrounded by coils 52 for energizing a pinch magnetic field in chamber 14. The magnetic field from coils 52 compresses the plasma formed in chamber 14 into a pinched plasma column 54. Thus, once a plasma is formed by microwaves input through waveguide 22, the coils 52 can be energized to pinch the plasma down to a small radius.

By using xenon gas, and a high microwave frequency of 6–10 GHz, $Xe^{+10}$ ions can be produced. The initial plasma can be about 3 cm in diameter, but by applying the axial pinch field, the diameter of the plasma column can be reduced to less than 2 mm, increasing the plasma density by over two orders of magnitude. The $Xe^{+10}$ ions in the plasma column 54 will emit EUV light at 13 nm in an axial direction. A window 56 can be positioned in the chamber 14 to extract the EUV radiation. By compressing the plasma column, the EUV light intensity has also been increased by over two orders of magnitude. If the source is operating in a pulsed mode, the xenon plasma density can be much higher than steady state operation. The combination of 6 or 10 GHz operation with a magnetic pinch will enable the microwave ion source to provide very intense EUV radiation.

Figure 9A:
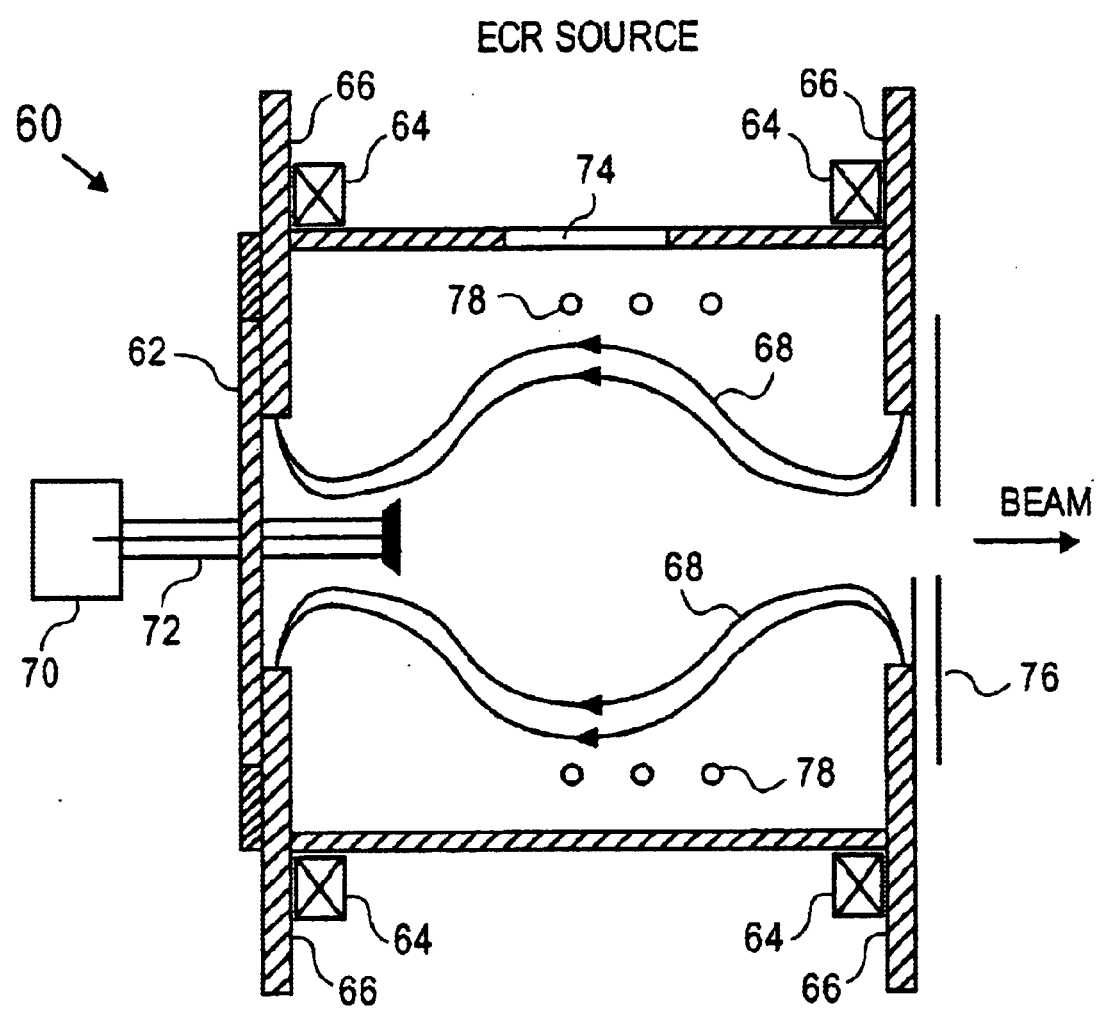
FIGS. 9A, B show alternate embodiments of a hybrid ECR-RF plasma ion source.

The above-described RF boosting modification of the microwave ion source can be applied more generally to conventional ECR sources. FIG. 9A shows a hybrid ECR-RF source 60. Source 60 is based on a conventional ECR source and has a chamber 62 with magnets 64 and soft iron flanges 66 to produce a magnetic field or magnetic bottle 68 therein. Microwave power from microwave power supply 70 is input into chamber 62 by coaxial microwave coupler or waveguide 72. Alternatively power may be input through a microwave window 74. An ion beam is extracted through extractor 76.

The conventional ECR source is modified by the addition of an RF antenna 78 which is coupled to an RF power supply (not shown). Antenna 78 is used to generate a background plasma in ion source 60 by inductive discharge of RF power. With several kW of RF power, e.g. at 2 MHz or 13.5 MHz, a dense plasma with high extractable current density can be produced. However, this RF driven discharge plasma will produce ions with a charge state of mostly +1. To increase the charge state, microwave power is introduced into the source. If only low charge states (+2, +3, +4) are needed, then low microwave frequency, e.g. 2.45 GHz, is used. If higher charge states are needed, then higher microwave frequency, e.g. 6 or 10 GHz, is employed. In either case, the extractable current is controlled by the RF input power while the charge state is controlled by the microwave input power and its frequency. With a combination of 13.5 MHz RF power and 2 GHz microwave power, $B^{+2}$ current as high as 6 mA can be generated from an aperture size of 9 mm in diameter.

Figure 9B:
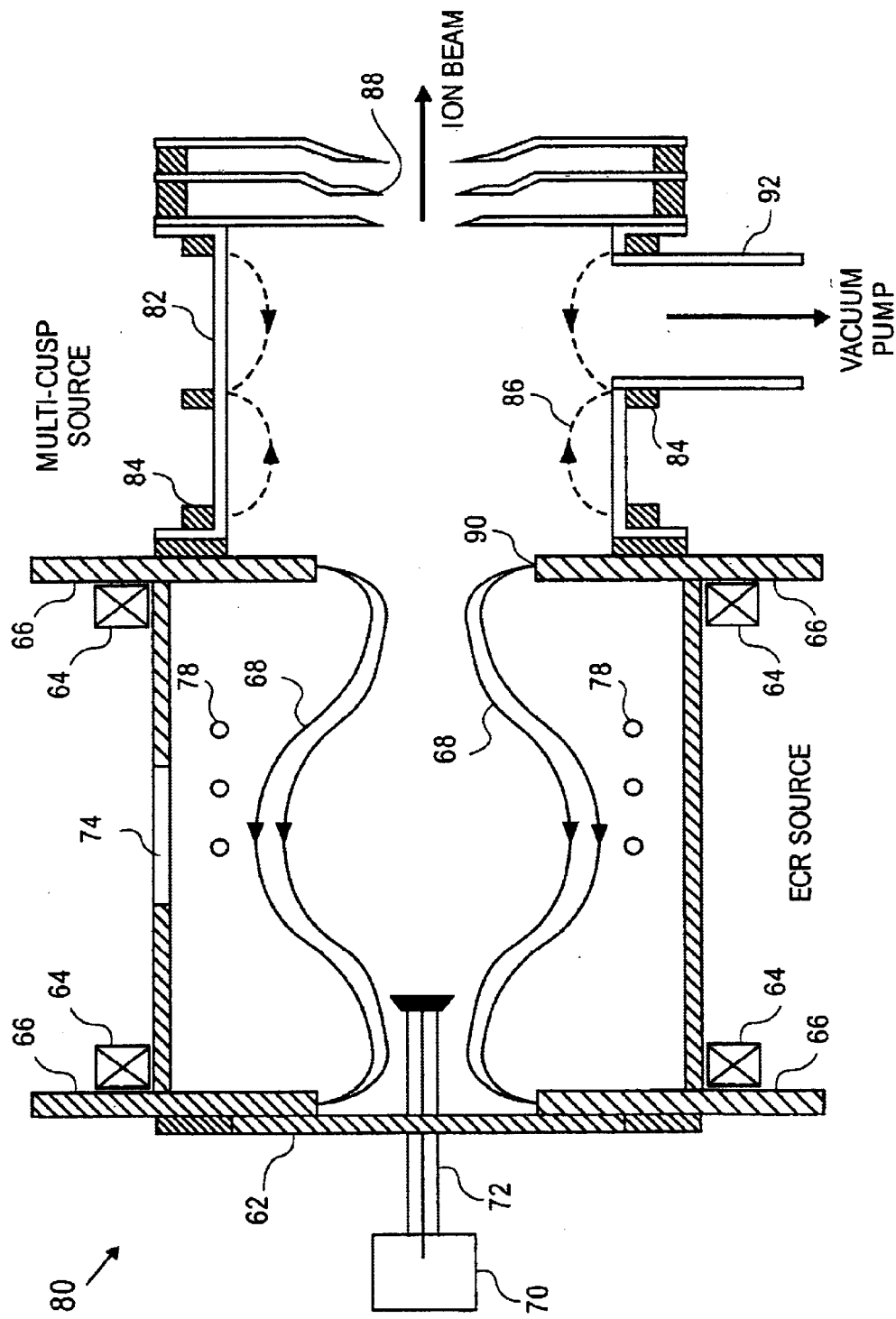

An alternate hybrid source 80, shown in FIG. 9B, has a multicusp chamber 82 attached to an ECR chamber 62. ECR source chamber 62 is similar to that in FIG. 9A except that chamber 82 is coupled to its output aperture 90 instead of an extractor. Plasma generated in ECR chamber 62 will diffuse through aperture 90 into multicusp chamber 82. Multicusp chamber 82 has a plurality of permanent magnets 84 to produce a multicusp magnetic field 86 therein.

An ion beam is extracted from chamber 82 through extractor 88. Since no axial field is present in chamber 82, beam emittance should be lower. In addition, high source pumping speed through outlet 92 provides a low pressure zone between extractor 88 and ECR source chamber 62. Therefore, the charge state of the ECR source plasma will be preserved when they arrive at the extraction aperture.

Figure 10:
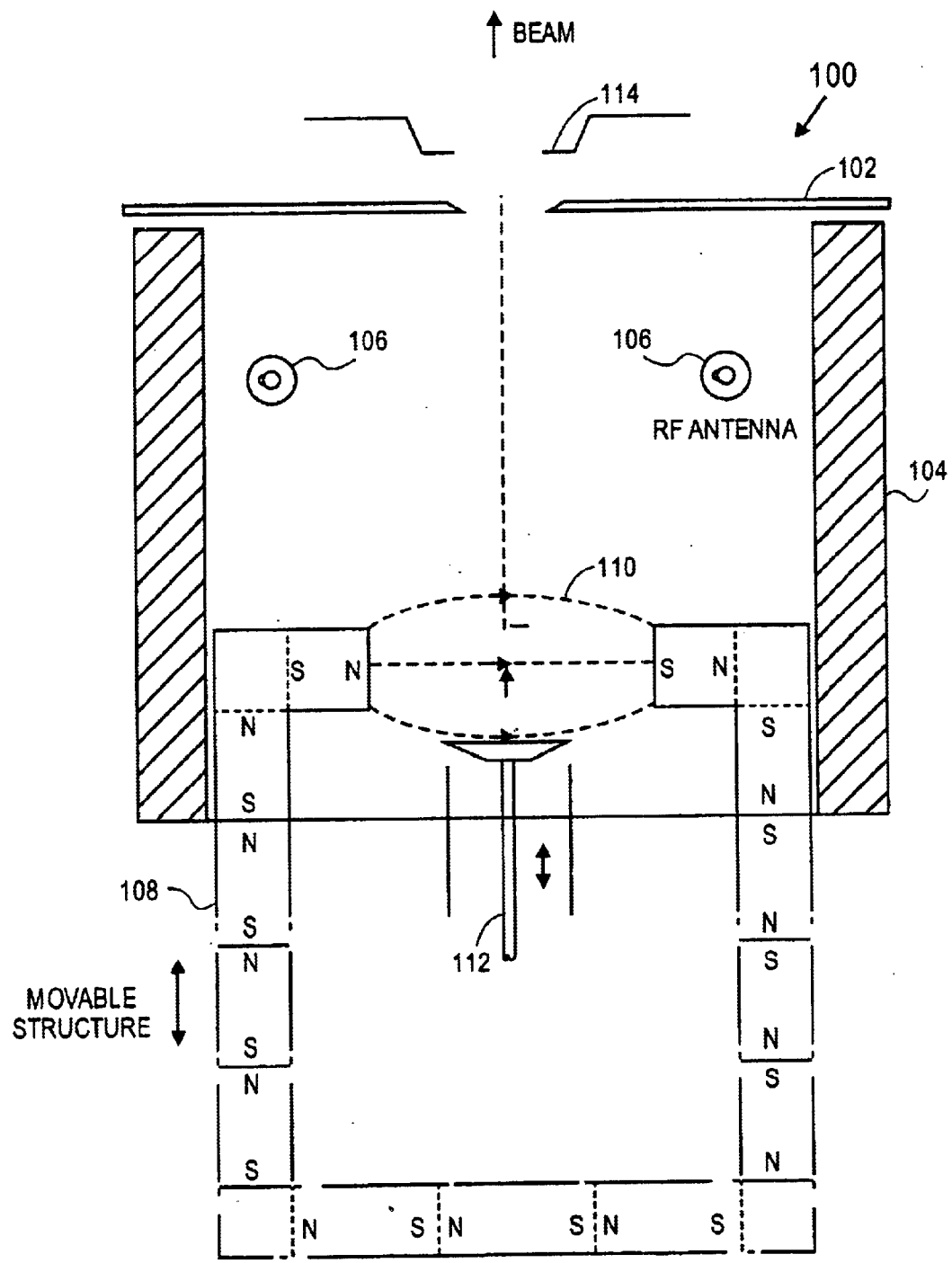
FIG. 10 shows another hybrid ECR-RF ion source.

Another hybrid ECR-RF source 100 is shown in FIG. 10. Chamber 102 is surrounded by permanent magnets 104 to create a magnetic cusp field and contains an RF antenna 106 for generating a plasma. A movable magnet structure which produces a magnetic dipole field 110 between opposed pole faces is adjustably moveable to various positions within chamber 102. A moveable microwave antenna or waveguide 112 moves with magnet structure 108 so that microwave power can be input into the magnetic dipole field 110. An ion beam is extracted through extractor 114.

Changes and modifications in the specifically described embodiments can be carried out without departing from the scope of the invention which is intended to be limited only by the scope of the appended claims.

What is claimed is:

1. A microwave ion source, comprising:
   a source chamber;
   a pair of spaced apart permanent magnet rings positioned in the chamber and producing a magnetic dipole field therebetween;
   a microwave generator outside the chamber;
   a microwave coupler extending from the microwave generator into the chamber to input microwave power into the chamber inside the magnetic dipole field to ionize a gas in the chamber by electron cyclotron resonance to produce a plasma;
   an extractor for extracting ions from the plasma in the chamber.

2. The microwave ion source of claim 1 wherein the permanent magnet rings are oriented in alignment so that the N pole of one ring faces the S pole of the other ring.

3. The microwave ion source of claim 1 wherein the dipole magnetic field is oriented substantially parallel to the axis of the ion source.

4. The microwave ion source of claim 3 wherein the ions are extracted substantially perpendicularly to the axis of the ion source.

5. The microwave ion source of claim 1 wherein the microwave coupler is a microwave antenna or waveguide.

6. The microwave ion source of claim 1 wherein the coupler is positioned to produce an electric field in the chamber that is substantially perpendicular to the magnetic dipole field.

7. The microwave ion source of claim 1 wherein the microwave generator is a microwave power supply with a frequency between about 2 GHz and about 10 GHz.

8. The microwave ion source of claim 7 wherein the microwave power supply has an output power between about 200 W and about 1 kW.

9. The microwave ion source of claim 1 further comprising:
   an RF power source outside the chamber;
   an RF antenna connected to the RF power source and extending into the chamber to ionize gas in the chamber by inductive discharge.

10. The microwave ion source of claim 9 wherein microwave generator and RF power source are operated simultaneously.

11. The microwave ion source of claim 9 wherein the RF power source has a frequency between about 2 MHz and about 14 MHz.

12. The microwave ion source of claim 1 further comprising pinch magnetic field coils surrounding the chamber for energizing a pinch magnetic field in the chamber to compress the plasma formed in the chamber into a pinched plasma column.

13. The microwave ion source of claim 12 wherein the chamber contains xenon gas and the microwave generator has a sufficiently high frequency to produce $Xe^{+10}$ ions.

14. The microwave ion source of claim 13 further comprising a window in the chamber for extracting EUV radiation emitted by the $Xe^{+10}$ ions.

15. The microwave ion source of claim 13 wherein the microwave generator has a frequency of about 6 GHz to about 10 GHz.

* * * * *